U S 0 1 0 5 4 1 2 7 0 B 2

US010541270B2

(12) United States Patent
La Rosa et al.

(10) Patent No.: US 10,541,270 B2
(45) Date of Patent: Jan. 21, 2020

(54) METHOD FOR FABRICATING AN ARRAY OF DIODES, IN PARTICULAR FOR A NON-VOLATILE MEMORY, AND CORRESPONDING DEVICE

(71) Applicant: STMicroelectronics (Rousset) SAS, Rousset (FR)

(72) Inventors: Francesco La Rosa, Rousset (FR); Stephan Niel, Meylan (FR); Arnaud Regnier, Les Taillades (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 16/004,195

(22) Filed: Jun. 8, 2018

(65) Prior Publication Data

US 2018/0294313 A1 Oct. 11, 2018

Related U.S. Application Data

(62) Division of application No. 15/365,143, filed on Nov. 30, 2016, now Pat. No. 10,002,906.

(30) Foreign Application Priority Data

Jun. 3, 2016 (FR) ..................................... 16 55067

(51) Int. Cl.
*H01L 27/24* (2006.01)
*H01L 45/00* (2006.01)
*H01L 27/12* (2006.01)

(52) U.S. Cl.
CPC .......... *H01L 27/2409* (2013.01); *H01L 45/06* (2013.01); *H01L 45/16* (2013.01); *H01L 27/1203* (2013.01); *H01L 27/2463* (2013.01); *H01L 45/04* (2013.01); *H01L 45/1233* (2013.01)

(58) Field of Classification Search
CPC . H01L 27/2409; H01L 27/1203; H01L 45/06; H01L 45/16; H01L 27/2463; H01L 45/04; H01L 45/123
USPC .............................................................. 257/4
See application file for complete search history.

(56) References Cited

U.S. PATENT DOCUMENTS

| | | | |
|---|---|---|---|
| 4,268,339 A * | 5/1981 | Urban ..................... | B32B 37/00 |
| | | | 156/272.2 |
| 5,414,245 A | 5/1995 | Hackleman | |
| 6,369,431 B1 | 4/2002 | Gonzalez et al. | |
| 6,865,117 B2 | 3/2005 | Kozicki | |
| 8,872,177 B2 * | 10/2014 | La Rosa ............... | G11C 27/024 |
| | | | 257/48 |
| 9,093,566 B2 * | 7/2015 | Fan .................... | H01L 29/66136 |
| 9,188,009 B2 * | 11/2015 | Yilmaz .................... | F02C 7/12 |
| 9,219,056 B2 * | 12/2015 | Clark, Jr. ............ | H01L 27/1211 |

(Continued)

FOREIGN PATENT DOCUMENTS

| CN | 1503365 A | 6/2004 |
|---|---|---|
| CN | 101106151 A | 1/2008 |

*Primary Examiner* — Viet Q Nguyen
(74) *Attorney, Agent, or Firm* — Seed IP Law Group LLP

(57) ABSTRACT

The array of diodes comprises a matrix plane of diodes arranged according to columns in a first direction and according to rows in a second direction orthogonal to the first direction. The said diodes comprise a cathode region of a first type of conductivity and an anode region of a second type of conductivity, the said cathode and anode regions being superposed and disposed on an insulating layer situated on top of a semiconductor substrate.

20 Claims, 8 Drawing Sheets

(56) References Cited

U.S. PATENT DOCUMENTS

| | | | |
|---|---|---|---|
| 9,318,622 B1 * | 4/2016 | Logan | H01L 29/868 |
| 9,458,109 B2 | 10/2016 | Wang et al. | |
| 9,818,478 B2 * | 11/2017 | Chung | G11C 13/0004 |
| 9,935,169 B2 * | 4/2018 | Nishimura | H01L 29/7396 |
| 10,002,906 B2 * | 6/2018 | La Rosa | H01L 45/06 |
| 10,056,368 B2 * | 8/2018 | Punchihewa | H01L 27/0629 |
| 10,147,733 B2 * | 12/2018 | La Rosa | H01L 29/788 |
| 2003/0206481 A1 | 11/2003 | Hsu et al. | |
| 2004/0002186 A1 * | 1/2004 | Vyvoda | H01L 27/1021 438/237 |
| 2004/0108528 A1 | 6/2004 | Hsu et al. | |
| 2006/0279328 A1 | 12/2006 | Kozicki et al. | |
| 2007/0215885 A1 | 9/2007 | Miyoshi et al. | |
| 2008/0144354 A1 * | 6/2008 | Choi | H01L 21/2256 365/148 |
| 2008/0179602 A1 | 7/2008 | Negley et al. | |
| 2009/0218591 A1 | 9/2009 | Grolier et al. | |
| 2009/0251940 A1 | 10/2009 | Ito | |
| 2010/0148324 A1 | 6/2010 | Chen et al. | |
| 2010/0171086 A1 | 7/2010 | Lung et al. | |
| 2010/0301304 A1 | 12/2010 | Chen et al. | |
| 2011/0037054 A1 | 2/2011 | Shieh et al. | |
| 2012/0001305 A1 | 1/2012 | Peroni et al. | |
| 2012/0051137 A1 | 3/2012 | Hung et al. | |
| 2012/0261804 A1 | 10/2012 | Li et al. | |
| 2013/0119505 A1 | 5/2013 | Harame et al. | |
| 2013/0258532 A1 | 10/2013 | Clark, Jr. et al. | |
| 2013/0285111 A1 | 10/2013 | Di Sarro et al. | |
| 2014/0160830 A1 | 6/2014 | Chung | |
| 2014/0183641 A1 * | 7/2014 | Fan | H01L 29/66136 257/365 |
| 2014/0239343 A1 | 8/2014 | Di Sarro et al. | |
| 2015/0104921 A1 | 4/2015 | Terai et al. | |
| 2015/0235908 A1 * | 8/2015 | Cheng | H01L 21/84 257/351 |
| 2016/0005969 A1 * | 1/2016 | Sasago | H01L 27/2409 438/382 |
| 2017/0047321 A1 | 2/2017 | Nishimura | |
| 2017/0194298 A1 | 7/2017 | Negley et al. | |
| 2019/0088717 A1 * | 3/2019 | Yeh | H01L 27/2454 |

* cited by examiner

METHOD FOR FABRICATING AN ARRAY OF DIODES, IN PARTICULAR FOR A NON-VOLATILE MEMORY, AND CORRESPONDING DEVICE

BACKGROUND

Technical Field

Various embodiments of the disclosure and their implementation relate to p-n junction diodes, and more particularly diode selector arrays used notably in non-volatile memories such as resistive memories (RRAM) or phase-change memories (PCRAM).

Description of the Related Art

Usually, the memories of the RRAM and PCRAM type comprise a memory plane comprising memory cells designed to store a binary data value, with a matrix arrangement in rows and columns. The access to a row generally takes place via a metal track referred to as word line and the access to a column generally takes place via a metal track referred to as bit line.

The controls for accessing the memory locations of the memories of the RRAM and PCRAM type can be formed by a selector array comprising diodes, which may for example be disposed under the memory plane of the memories.

In summary, each memory cell is connected to a word line and to a bit line, and the various configurations of the voltages applied to the word and bit lines allow a data value in a memory cell to be read, to be programmed or to be erased.

Each memory cell is connected in series with a diode of the selector array whose forward or reverse conducting state or non-conducting state, depending on the voltages, allows a given memory cell to be selected.

BRIEF SUMMARY

The diodes of the selector array are conventionally directly formed in a semiconductor substrate, which can introduce undesirable bipolar effects.

Indeed, recurrent problems have been observed in the use of diodes whose doped regions are directly implanted into the substrate or into a well. These undesirable bipolar effects are for example due to parasitic p-n junctions with the substrate and are generally observed at power-up and during the use of the array.

It is desirable to avoid these parasitic bipolar effects with the substrate, in a manner that is simple and is compatible with the technologies for non-volatile memories.

Furthermore, certain etch processes in the usual methods for fabrication of diodes exhibit constraints with regard to size reduction, for example owing, on the one hand, to masks requiring a precise alignment and, on the other hand, owing to a variation in the form factor of the etched structures.

As a consequence, it is also desirable to improve the control of the said etch processes.

For this purpose, a method for fabricating an array of diodes is provided, comprising:

the formation of an initial structure comprising the formation of an insulating layer on the surface of a semiconductor substrate and the formation of a first layer of silicon of a first type of conductivity on the insulating layer, then the formation of a buffer layer on the first layer of silicon, the etching of the buffer layer in strips running in a first direction, the formation of a second layer of silicon of a second type of conductivity, the etching down to the insulating layer of the second layer of silicon, of the strips of the buffer layer and of the first layer of silicon, in strips running in a second direction orthogonal to the first direction, and the removal, by etching in the second layer of silicon and down to the buffer layer, of strips running in the first direction situated facing the strips of the buffer layer, so as to form pads of silicon of the second type of conductivity.

As a variant, the step for formation of the initial structure is replaced by the use of a substrate of the fully-depleted silicon-on-insulator type (well known to those skilled in the art under the acronym FDSOI) whose semiconductor film is doped with the first type of conductivity.

The first and/or the second layer of silicon may comprise polycrystalline silicon.

According to one variant, the initial structure is a substrate of fully-depleted silicon-on-insulator whose semiconductor film is doped in order to form the first layer of silicon and whose second layer of silicon is formed by epitaxial growth.

The first and second layers of silicon may be doped in-situ or by implantation.

According to one embodiment, the strips removed by etching in the second layer of silicon and down to the buffer layer are narrower than the strips of the buffer layer.

The buffer layer advantageously comprises a layer of an insulating material; for example the buffer layer may comprise a superposition of oxide-nitride-oxide of silicon or a layer of silicon nitride of $Si_3N_4$.

According to one embodiment, the strips of the first layer of silicon running in the second direction are connected to respective metal tracks running in the second direction, via metal contacts regularly disposed in the second direction.

According to one embodiment, each pad of silicon of the second type of conductivity is connected to memory cells via metal contacts.

According to another aspect, a device is provided comprising an array of diodes comprising a matrix plane of diodes arranged according to columns in a first direction and according to rows in a second direction orthogonal to the first direction, the said diodes comprising a cathode region of a first type of conductivity and an anode region of a second type of conductivity, the said cathode and anode regions being superposed and disposed on an insulating layer situated on top of a semiconductor substrate.

According to one embodiment, the cathode regions are common to the diodes of the same row and take the form of a strip running in the second direction, and the anode regions take the form of a pad and are in contact with the cathode region.

The cathode regions are advantageously situated directly on the insulating layer.

According to one embodiment, the anode regions of the diodes of the same row are separated from one another by portions of the strips of a buffer layer and straddle the edges of the said portions of strips.

According to one embodiment, the anode regions are connected to respective memory cells via metal contacts.

The cathode regions may also be connected in parallel to respective metal tracks running in the second direction, via metal contacts regularly disposed in groups of at least one diode.

In other words, the various embodiments and their implementation provided relate to diodes completely insulated from the substrate. As a result, no parasitic bipolar effect with the substrate due to a p-n junction between a doped region of the diode and the substrate can occur.

According to another aspect, a non-volatile memory is also provided comprising a memory plane and a device such as defined hereinbefore forming a selector array of diodes designed to select the memory cells of the memory plane.

The non-volatile memory may for example be of the resistive or phase-change memory type.

Indeed, the various embodiments and their implementation provided are notably totally compatible with the technological constraints of use and of fabrication of non-volatiles memories, in particular the non-volatiles memories of the RRAM and PCRAM type.

For example, the embodiments provided allow the diodes to be formed without adding a masking step, critical as regards alignment, for the etch process finalizing the formation of pads of silicon.

Furthermore, the various masking steps advantageously only employ masks taking the form of strips, notably allowing the contact surface of the said masks to be increased, with respect to a conventional etch process in which the masks take the form of pads, notably improving the control of the form factor of the etch, in particular for reduced dimension.

Thus, the embodiments and their implementation provided are optimized for the technological node, notably as regards the minimization of the surface occupied by the selector array of diodes.

BRIEF DESCRIPTION OF THE SEVERAL VIEWS OF THE DRAWINGS

Other advantages and features of the disclosure will become apparent upon examining non-limiting embodiments of the disclosure and their implementation and from the appended drawings in which.

DETAILED DESCRIPTION

FIGS. 1 to 7 comprise a top view of a portion of a selector array of diodes at various stages in the implementation of its method of fabrication, together with, for the sake of clarity, cross-sectional views through planes respectively referenced AA, BB and CC.

Figure 1:
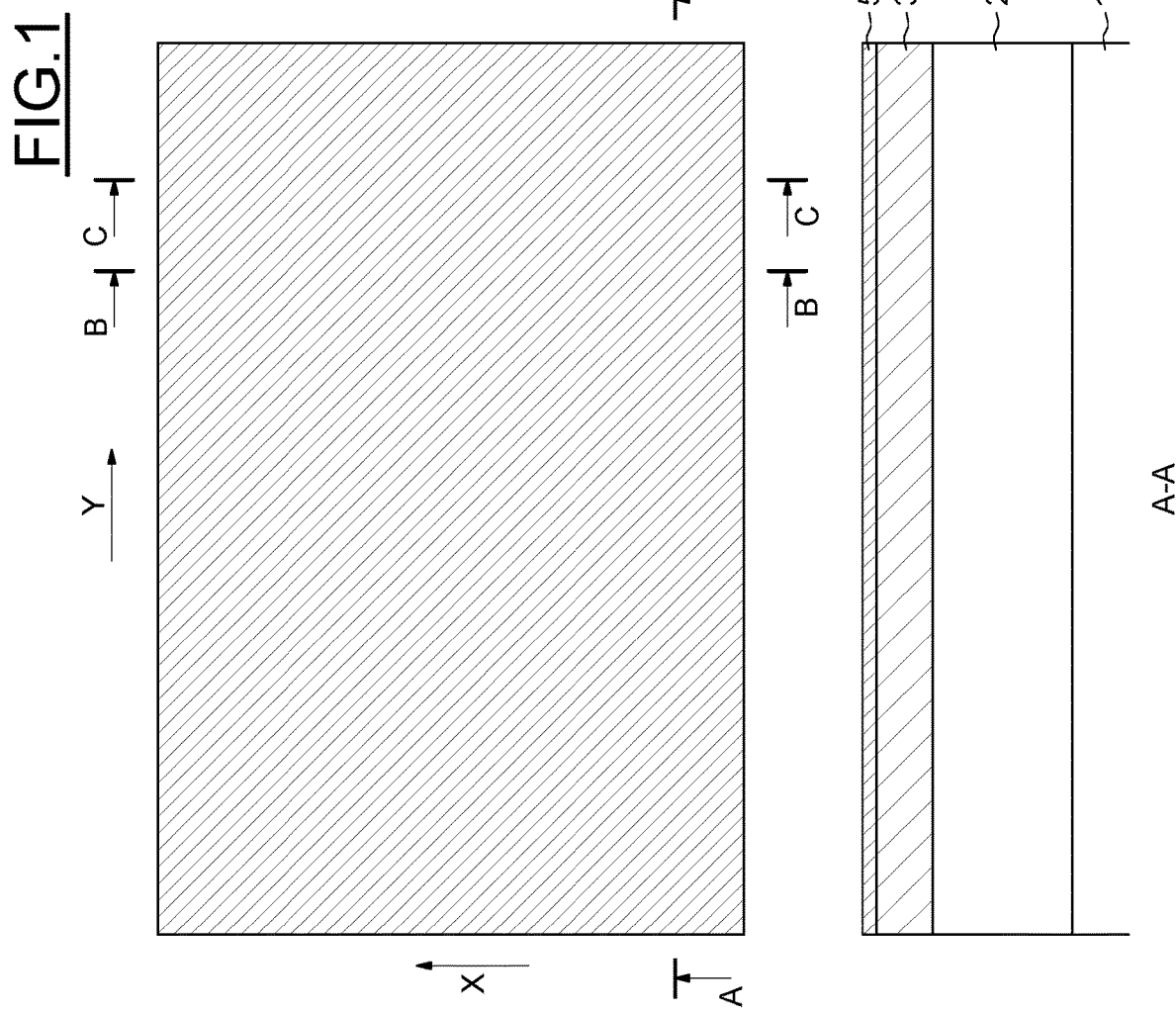
FIGS. 1 to 7 show steps of one embodiment of a method for fabricating a selector array of diodes.

FIG. 1 shows an initial step during which a buffer layer 5 is deposited on a structure called initial structure IS.

The initial structure IS may be obtained for example by forming an insulating layer 2, for example of a dielectric material, on a semiconductor substrate 1, and by depositing a first layer of silicon 3, for example polycrystalline silicon, of a first type of conductivity (for example of the n type). As used herein, the word "silicon" by itself (as opposed to with another material such as silicon nitride or silicon oxide) is intended to refer to semiconductive silicon, and one skilled in the art would understand that such semiconductive silicon could be replaced by an alternate semiconductor such as germanium or gallium arsenide.

In the following, the usual term "polysilicon" is employed to denote polycrystalline silicon.

As a variant, the initial structure IS may be a structure of the conventional FDSOI substrate type, comprising a semiconductor film on top of a buried insulating layer (BOX: "Buried Oxide") itself on top of a carrier substrate. The initially intrinsic semiconductor film of the FDSOI substrate is doped in order to form the layer of silicon 3 of the first type of conductivity, for an application using FDSOI technology which is advantageous in certain technological nodes.

The BOX layer forms the insulating layer 2 and the carrier substrate forms the substrate 1.

The buffer layer 5 is formed from an insulating material, which may for example be a superposition of layers of silicon oxide, silicon nitride and silicon oxide, or else a single layer of silicon nitride ($Si_3N_4$).

At this stage, the cross-sectional view through the plane CC is identical to the cross-sectional view through the plane BB, and as a consequence is not shown here.

Figure 2:
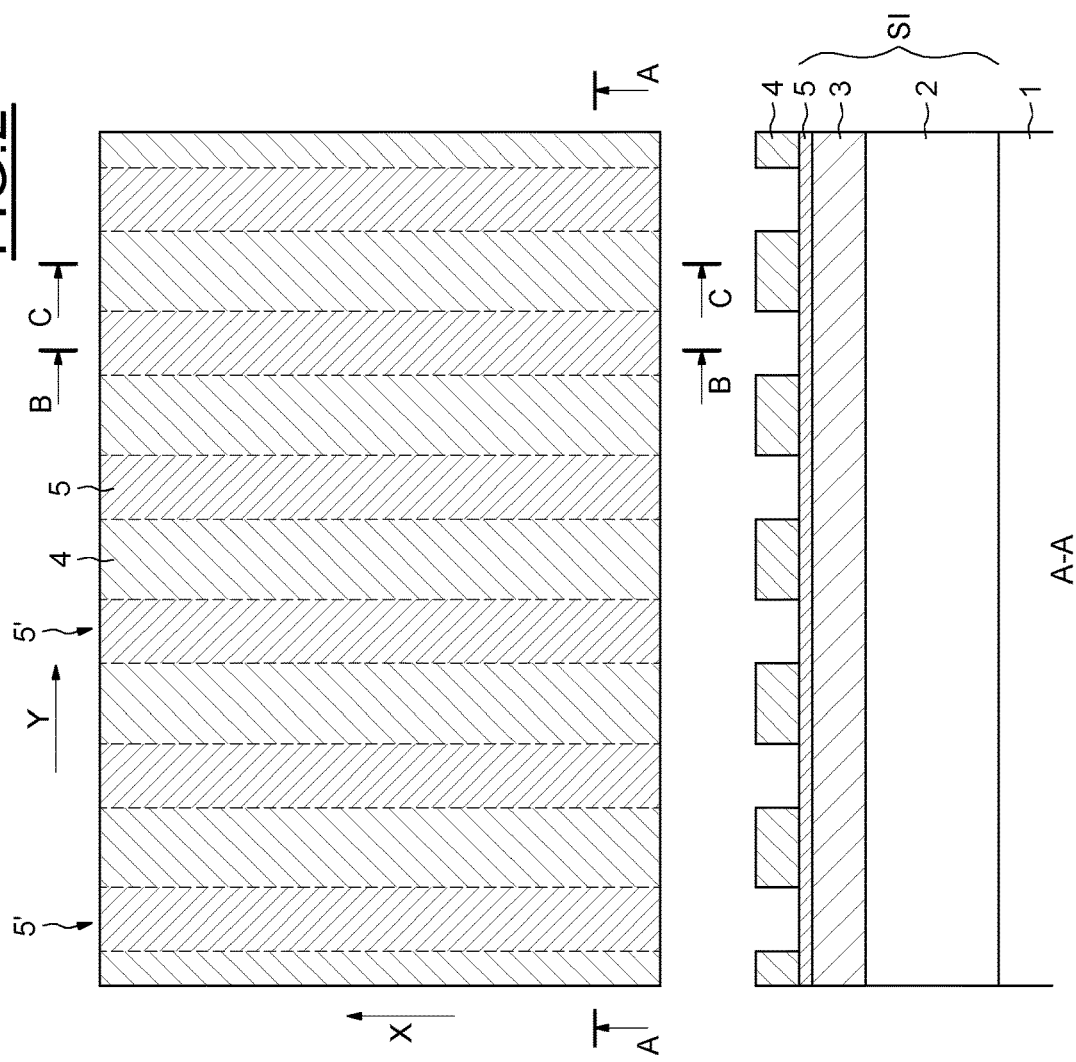

FIG. 2 shows a masking step, during which a resist mask 4 has been formed on the buffer layer 5.

The resist mask 4 is configured so that the uncovered part of the buffer layer 5 forms strips 5' running lengthwise in a first direction X.

Figure 3:
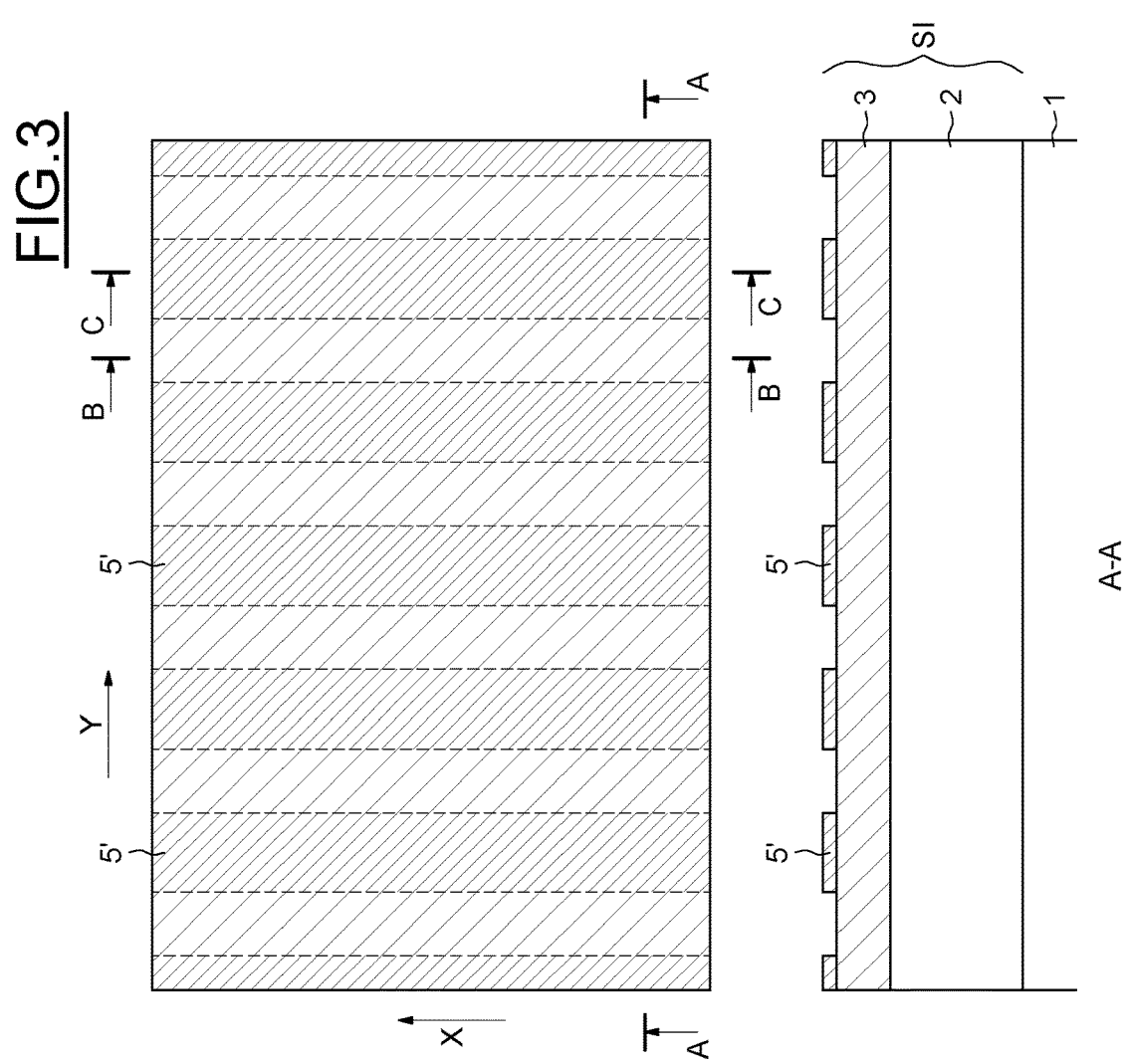

FIG. 3 shows the result of the selective etching of the buffer layer 5 down to the first layer of silicon 3, and of the removal of the resist mask 4, which leaves the strips 5' of the buffer layer on the first layer of silicon 3.

Figure 4:
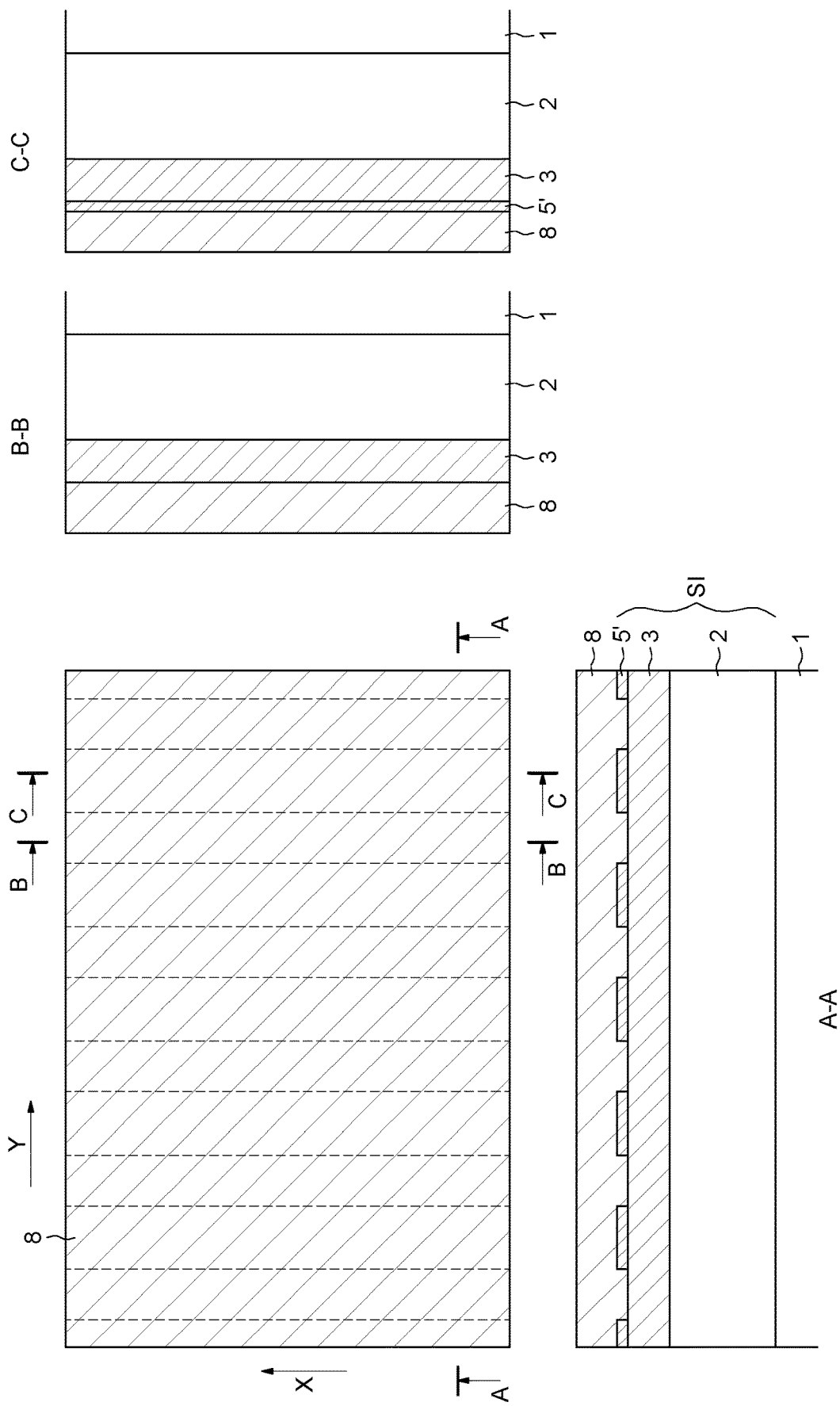

FIG. 4 shows a step during which a second layer of silicon 8 of a second type of conductivity (for example of the p type) has been formed on the structure previously obtained relating to FIG. 3.

The second layer of silicon 8 may for example be formed by deposition of polysilicon or may be obtained by epitaxial growth.

Figure 5:
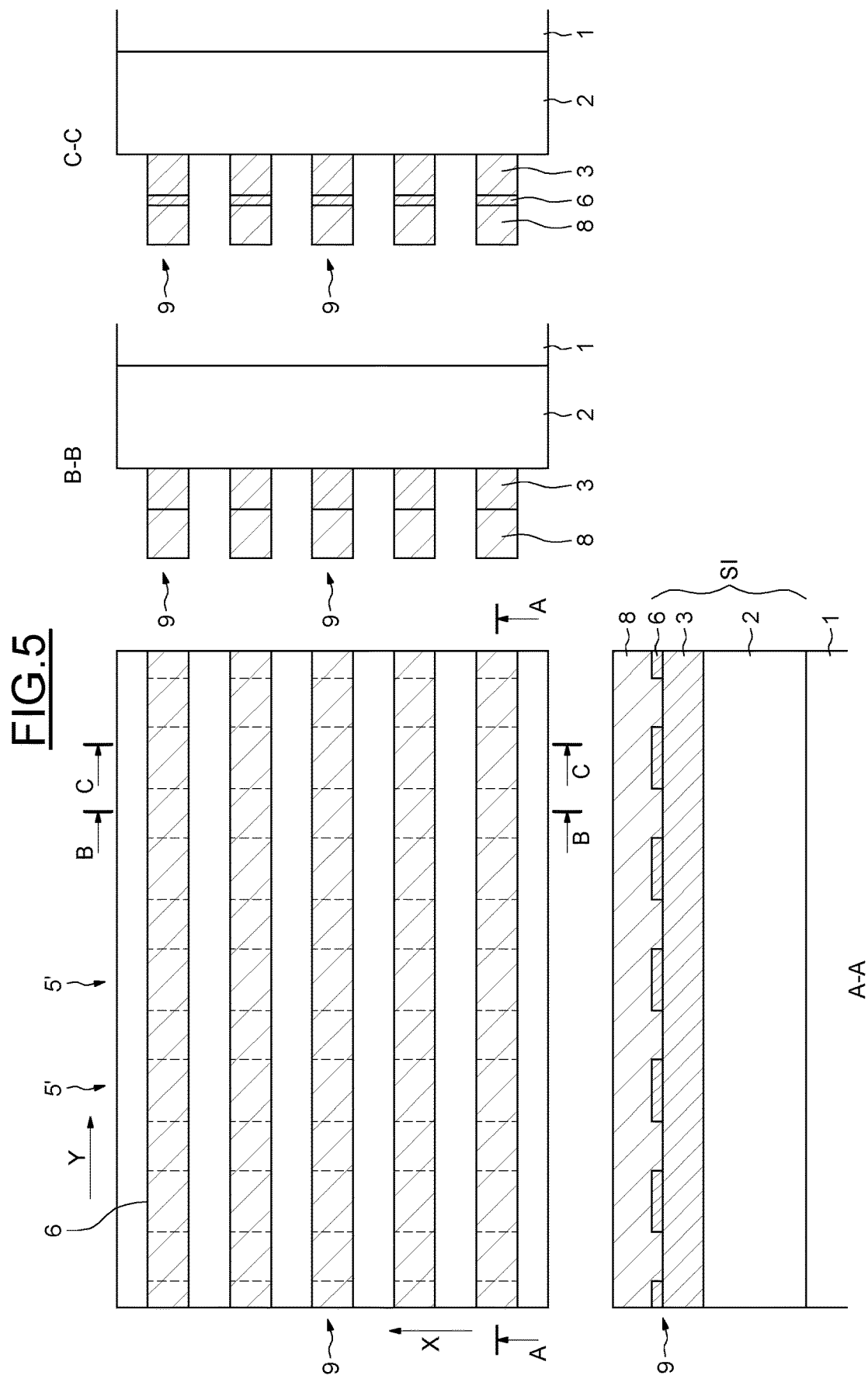

FIG. 5 shows the result of an etching step using a mask similar to the step described in relation with FIG. 2, but leaving uncovered strips running lengthwise in a second direction Y, orthogonal to the first direction X.

During this etching step, the second layer of silicon 8, the strips 5' of the buffer layer 5 and the first layer of silicon 3 are etched.

The etch is stopped by the insulating layer 2 and is carried out in order that the remaining parts of the three etched layers 3, 5, 8 take the form of strips 9 running lengthwise in the second direction Y.

The remaining parts of the strips 5' of the buffer layer form portions of strips and are represented by dashed lines carrying the reference 6 in this representation and also in the following.

Figure 6:
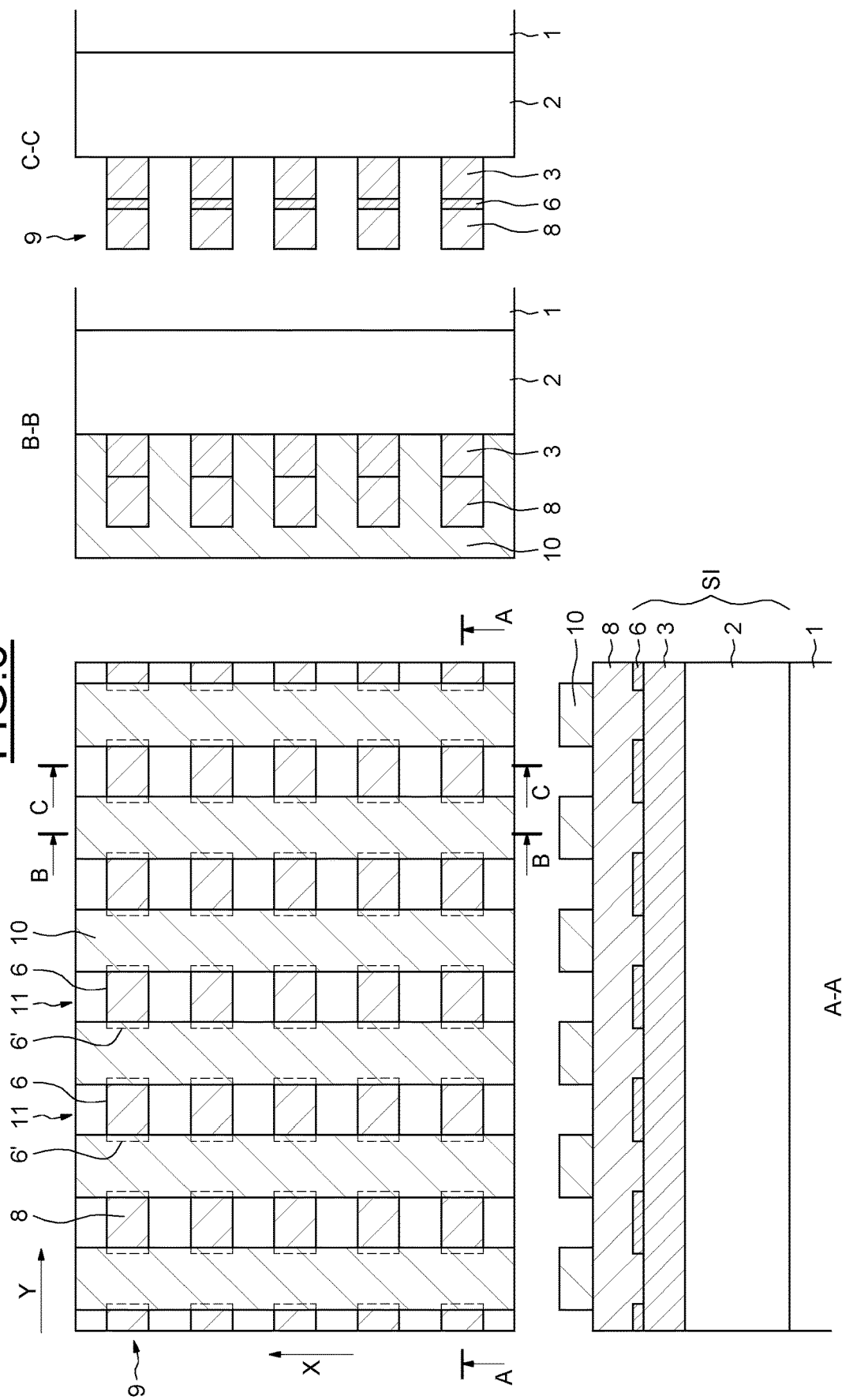

FIG. 6 shows a masking step during which a mask 10 leaves uncovered strips 11 running lengthwise in the first direction X of the strips 9 previously obtained relating to FIG. 5.

The uncovered strips 11 are situated facing the portions of strips 6 of the buffer layer 5, and are narrower than the strips 5' of the buffer layer 5 previously obtained.

Thus, this masking step is not critical with regard to alignment because, as will be seen in more detail hereinafter, the surface of the active region of the diodes depends on the disposition of the portions of strips 6 of the buffer layer 5 and not on the alignment of the mask for this etch process.

Figure 7:
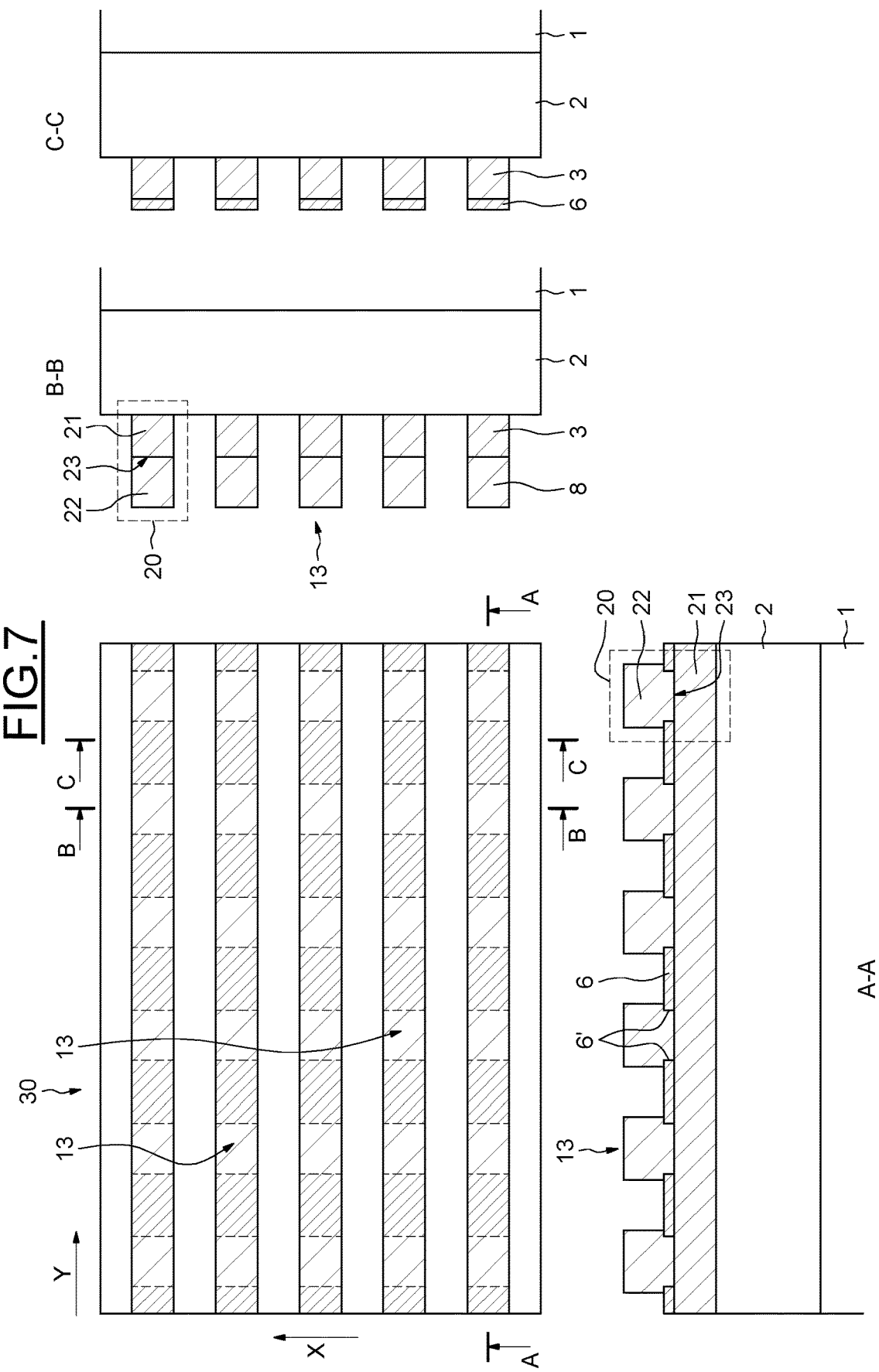

FIG. 7 shows the structure obtained after a selective etching of the second layer of silicon 8 down to the buffer layer 5 and the removal of the mask 10.

The remaining parts of the second layer of silicon 8, etched in strips in two orthogonal directions, form pads 13 of square or rectangular shape.

Thus, the pads 13 of silicon of the second type of conductivity, form anodes 22 of diodes 20 arranged as a matrix according to the two directions X and Y. The cathodes 21 of the diodes 20 are formed by strips 9' of the first layer of silicon 3 that remain after the portions of the second silicon layer 8 of the strip 9 are removed in the selective etch depicted in FIG. 7. Each remaining strip 9' of the the first silicon layer is common to all the diodes of a respective row of a selector array 30 of diodes 20 thus formed.

The cathode 21 and the anode 22 of a diode 20 are in contact at an interface 23, forming a p-n junction. The surface of the interface 23 corresponds to the surface included between two portions of strips 6 of the buffer layer, bounded by the edges 6' of the said portions of strips 6.

Furthermore, the diodes 20 formed by this method are totally insulated from the semiconductor substrate 1 by the insulating layer 2, which, consequently, are not subject to a parasitic bipolar effect with the substrate.

Figure 8:
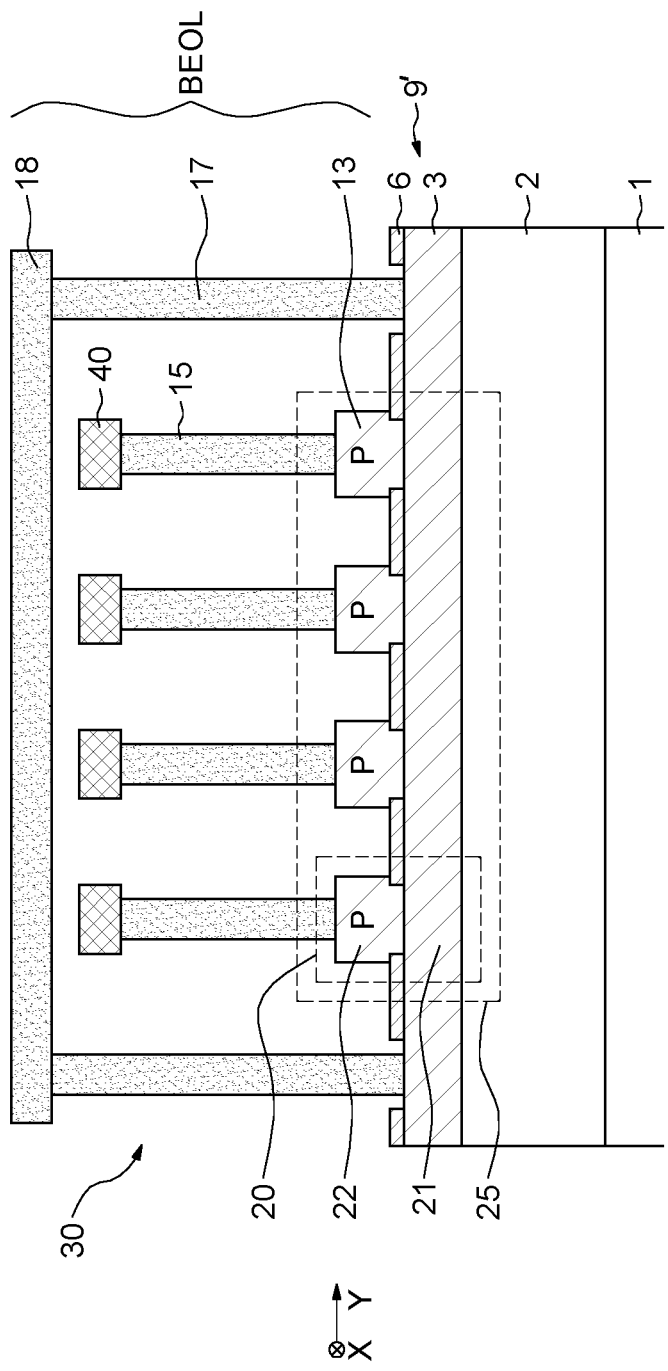
FIGS. 8 and 9 show one embodiment of a selector array of diodes.

FIG. 8 shows a cross-sectional view of one embodiment of a selector array, corresponding to the structure, relating to FIG. 7, obtained by the method previously described.

Figure 9:
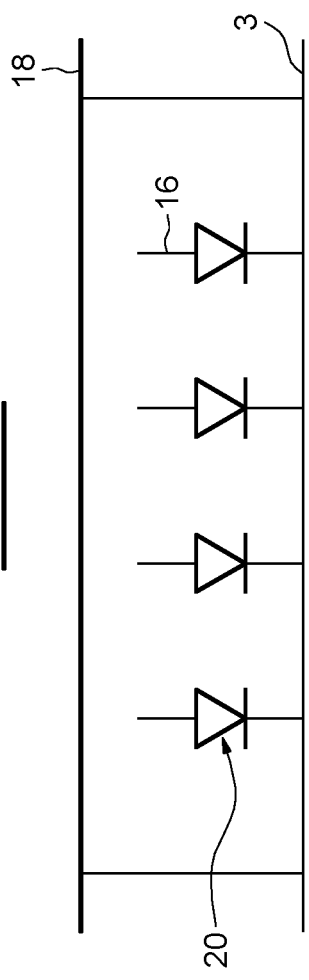

FIG. 9 shows the electronic circuit diagram of the embodiment illustrated in FIG. 8.

Contacts 15 have been formed connecting the anodes 22 of the diodes 20 to respective memory cells 40 situated within a section of back-end-of-line (BEOL) interconnections, shown very schematically here.

The strips 9' of the first layer of silicon 3 form word lines. However, in order to reduce the resistivity of the word lines, a "strapping" (according to a commonly used term) of the polysilicon 3 is advantageously carried out.

The strapping corresponds to the connection in parallel of the strip 9' of polysilicon with a metal track 18 running in the second direction Y.

The connection between the strip 9' and the track 18 is made by metal contacts 17 regularly disposed in the second direction Y, along the word line, in groups 25, here, of four diodes 20.

In other words, on each word line, a contact 17 connects the metal track 18 in parallel with the strip 9' of polysilicon between each group 25 of diodes 20.

The number of diodes 20 per group 25 can vary according to the intended use of the selector array 30, notably as a function of the applied currents and of the resistivity of the first layer of silicon 3.

It is also possible for a group to only contain a single diode 20, in which case a contact 17 made between each of the single diodes 20 connects the strip 9' of silicon to a metal track 18.

In summary, according to one embodiment, the formation of a selector array is described comprising a matrix plane of diodes arranged according to columns in a first direction and according to rows in a second direction orthogonal to the first direction. The diodes comprise a cathode region of a first type of conductivity and an anode region of a second type of conductivity, the said cathode and anode regions being superposed and in contact on an interface whose surface is controlled. The diodes are disposed on an insulating layer formed on the surface of a semiconductor substrate, allowing the diodes to be insulated from the rest of the substrate.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
fabricating an array of diodes, the fabricating including:
forming an insulating layer on a surface of a semiconductor substrate;
forming a first semiconductor layer of a first type of conductivity on the insulating layer;
forming a dielectric buffer layer on the first semiconductor layer;
etching the dielectric buffer layer into strips running lengthwise in a first direction;
forming a second semiconductor layer of a second type of conductivity;
etching, down to the insulating layer, the second semiconductor layer, the strips of the dielectric buffer layer, and the first semiconductor layer, into strips running lengthwise in a second direction orthogonal to the first direction, each strip of the second semiconductor layer being positioned over a strip of the first semiconductor layer and a plurality of discrete pads of the dielectric buffer layer between the strip of the second semiconductor layer and the strip of the first semiconductor layer; and
removing by etching, down to the buffer layer, strips of the second semiconductor layer running lengthwise in the first direction, in such a manner as to form semiconductor pads of the second semiconductor layer on strips of the first semiconductor layer, adjacent ones of the semiconductor pads being separated by a respective discrete pad of the plurality of discrete pads of the dielectric buffer layer.

2. The method according to claim 1, in which at least one of the first and second semiconductor layers comprise polycrystalline silicon.

3. The method according to claim 1, in which:
the substrate and insulating layer are part of a fully-depleted silicon-on-insulator that includes a first layer of silicon;
forming the first semiconductor layer includes doping the first layer of silicon; and
forming the second semiconductor layer includes forming a second layer of silicon by epitaxial growth from the first semiconductor layer.

4. The method according to claim 1, in which the first and second semiconductor layers are doped in-situ or by implantation.

5. The method according to claim 1, in which etching, down to the insulating layer, the second semiconductor layer, the strips of the buffer layer, and the first semiconductor layer includes removing strips of the second semiconductor layer that are narrower than the strips of the dielectric buffer layer.

6. The method according to claim 1, in which the dielectric buffer layer comprises a layer of an insulating material.

7. The method according to claim 6 in which the dielectric buffer layer comprises a superposition of silicon oxide-silicon nitride-silicon oxide or a layer of silicon nitride ($Si_3N_4$).

8. The method according to claim 1, comprising:
forming metal contacts on the strips of the first semiconductor layer, the metal contacts being regularly spaced apart from each other in the second direction; and
forming respective metal tracks, running in the second direction, connected to the strips of the first semiconductor layer via the metal contacts.

9. The method according to claim 1, comprising connecting the semiconductor pads to respective memory cells via respective metal contacts.

10. A method, comprising:
patterning a dielectric layer on a wafer into dielectric strips oriented in a first direction, the dielectric layer being over a first semiconductor layer, the first semiconductor layer being over an insulation layer that is over a substrate of the wafer;
forming a second semiconductor layer over the dielectric strips;
patterning the second semiconductor layer, the first semiconductor layer and the dielectric strips into fin structures oriented in a second direction orthogonal to the first direction, each fin structure including a strip of the second semiconductor layer over a strip of the first semiconductor layer and a plurality of discrete dielectric pads between the strip of the second semiconductor layer and the strip of the first semiconductor layer; and
forming discrete semiconductor pads by patterning the fin structures, adjacent discrete semiconductor pads being separated by a respective dielectric pad of the plurality of discrete dielectric pads in the second direction.

11. The method according to claim 10, wherein the discrete semiconductor pads contact the first semiconductor layer.

12. The method according to claim 10, wherein a discrete semiconductor pad of the discrete semiconductor pads contacts a discrete dielectric pad of the plurality of discrete dielectric pads by a surface of the discrete dielectric pad opposite to the first semiconductor layer.

13. The method of claim 12, wherein the discrete semiconductor pad of the discrete semiconductor pads contacts two discrete dielectric pads of the plurality of discrete dielectric pads.

14. The method according to claim 10, wherein the first and second semiconductor layers include different electrical conductivity types.

15. The method according to claim 10, wherein the first and second semiconductor layers include different semiconductor materials.

16. The method according to claim 10, wherein the patterning the second semiconductor layer, the first semiconductor layer and the dielectric strips etches the first semiconductor layer until a surface of the insulation layer is reached.

17. The method according to claim 10, wherein the patterning the fin structures etches the strip of the second semiconductor layer until surfaces of the discrete dielectric pads are reached.

18. The method according to claim 10, wherein a discrete semiconductor pad of the discrete semiconductor pads includes a T-shaped cross-sectional profile.

19. A method, comprising:
forming an insulating layer over a surface of a substrate;
forming a first semiconductor layer of a first type of conductivity over the insulating layer;
forming a dielectric buffer layer over the first semiconductor layer;
patterning the dielectric buffer layer into a buffer strip oriented in a first direction;
forming a second semiconductor layer of a second type of conductivity over the buffer strip;
forming a fin structure oriented in a second direction different from the first direction by patterning, down to the insulating layer, the second semiconductor layer, the buffer strip, and the first semiconductor layer, each fin structure including a strip of the second semiconductor layer positioned over a strip of the first semiconductor layer, a plurality of discrete pads of the dielectric buffer layer being positioned between the strip of the second semiconductor layer and the strip of the first semiconductor layer; and
forming a discrete semiconductor pad by further patterning the second semiconductor layer of the fin structure, adjacent ones of the semiconductor pads being separated by a respective discrete pad of the plurality of discrete pads of the dielectric buffer layer.

20. The method according to claim 19, further comprising forming a contact structure over the discrete semiconductor pad.

* * * * *